United States Patent
Tzu

(10) Patent No.: US 6,201,302 B1
(45) Date of Patent: Mar. 13, 2001

(54) SEMICONDUCTOR PACKAGE HAVING MULTI-DIES

(75) Inventor: Chung-Hsing Tzu, Taipei (TW)

(73) Assignee: Sampo Semiconductor Corporation, Tayuan Hsien (TW)

( * ) Notice: Subject to any disclaimer, the term of this patent is extended or adjusted under 35 U.S.C. 154(b) by 0 days.

(21) Appl. No.: 09/223,839

(22) Filed: Dec. 31, 1998

(51) Int. Cl.$^7$ .................................................. H01L 23/34
(52) U.S. Cl. ........................ 257/724; 257/686; 257/738; 257/777; 257/780; 257/783; 257/790
(58) Field of Search ................................... 257/685, 686, 257/737, 738, 777, 778, 780, 782, 783, 787, 790; 438/108, 124, 109, 126, 127; 361/735, 748, 760, 764, 809

(56) References Cited

U.S. PATENT DOCUMENTS

| | | | |
|---|---|---|---|
| 5,578,869 | * 11/1996 | Hoffman et al. | 257/691 |
| 5,696,666 | * 12/1997 | Miles et al. | 361/764 |
| 5,760,478 | * 6/1998 | Bozso et al. | 257/777 |
| 5,869,894 | * 2/1999 | Degani et al. | 257/723 |
| 5,949,135 | * 9/1999 | Washida et al. | 257/685 |
| 5,963,429 | * 10/1999 | Chen | 361/764 |

FOREIGN PATENT DOCUMENTS 2-126685 * 5/1990 (JP).

OTHER PUBLICATIONS

"Reworkable Chip–On–Board Package", IBM Technical Disclosure Bulletin, vol. 29, No. 3, Aug. 1986, pp. 1433 and 1444.*

* cited by examiner

Primary Examiner—Olik Chaudhuri
Assistant Examiner—Alonzo Chambliss
(74) Attorney, Agent, or Firm—Sughrue, Mion, Zinn, Macpeak & Seas, PLLC

(57) ABSTRACT

The package includes a substrate having an opening. A first die is mounted on the upper surface of the substrate. A second die is attached on the lower surface of the first die by epoxy. The first die is encapsulated by mold compound. A plurality of solder balls are mounted on the substrate to establish a thermal and electrical connection. The modified embodiment is also possible to use a conductive plate between the first and second dies. A further embodiment includes a multi-layer substrate. Apertures are respectively formed in the layers of the substrate and are enlarged from the layer under the uppermost layer to the lowermost layer. A first die is attached on the top surface of the uppermost layer of the multi-layer substrate and is electrically connected to the conductive traces by using bonding wires. A second die is attached on the lower surface of the uppermost layer of the substrate. Mold compound covers the first die and a cap is attached to the lower surface of the multi-layer substrate. Solder balls are arranged on the lower surface of the multi-layer substrate for communicating with external modules.

18 Claims, 3 Drawing Sheets

SEMICONDUCTOR PACKAGE HAVING MULTI-DIES

FIELD OF THE INVENTION

The present invention relates to a semiconductor package, and more specifically, to a package having multiple dies formed therein.

BACKGROUND OF THE INVENTION

Integrated circuits manufactures are constantly striving to reduce semiconductor device sizes. With the rapid advances in wafer fabrication process technology, IC designers are always tempted to increase chip level integration at an ever faster pace. It has been the trend in integrated circuit (IC) technology to make small, high speed and high density devices. Thus, the density of semiconductor devices per unit area of silicon wafer is increased. It follows then that the semiconductor devices, such as transistors and capacitors, must be made smaller and smaller.

In recent years, there has existed a high interest of developing the ball grid array (BGA) package and assembly technology. It is because that the renewed desire in high density hybrid is driven by the requirement of larger numbers of electrical connections, the increasing clock rate of digital systems. However, a conventional lead frame package meets an obstacle to increase the number of the package's lead. Thus, the requirement of the operation speed is limited by such packages. The industry has moved away from the use of pins as connectors for the semiconductor package due to the aforesaid reason and the limitation on the input/output pins. As a result, solder ball have been used to meet the present and further demand, one of such solder ball electrical connection technologies is known as ball grid array (BGA) semiconductor package that is superior to pins. The BGA offers many advantages over conventional packages such as solder ball I/O and high speed due to a short path for signal transformation.

As well known in the art, the BGA package includes a substrate with a semiconductordie formed thereon. A plurality of bond pads are mounted to the top surface of the substrate. Gold wires are electrically connected these bond pads to a plurality of conductive traces formed on the substrate. The conductive traces each terminate with a pad where a solder ball is attached. Typically, an encapsulating material covers the die and the substrate for preventing the moisture. One of such BGA is disclosed in U.S. Pat. No. 5,640,047. In the package, solder balls 24, 25 are connected with a printed wiring board. The surface of the ground plane 22 is made of copper leaf that is covered by a second dielectric layer 26. The first and second outer connecting terminal lands 21, 23 that are exposed to atmosphere by means of flux. A semiconductor die 32 is mounted by using a conductive adhering agent 31. Electrode pads mounted on the die 32 are connected to the wire bonding portions 18.

A further BGA package is developed by Motorola, which can be seen in U.S. Pat. No. 5,583,377. The package 10 includes circuitized substrate 12 having a plurality of conductive traces 14 formed thereon. Conductive pads 16 are formed on the bottom surface of the substrate 12. The electrical signal is routed from the substrate 12 to the die 13 by using wires 19. The conductive pads 16 and solder balls 21 are formed in a matrix configuration for external signal accessing to the die 13. A plurality of vias 18 are extended through the substrate 12 for electrical coupling. The device 10 also has a heat sink 22 having a cavity for receiving the die 13.

However, none of the aforementioned packages can receive multiple semiconductor dies in the device. Thus, what is required is a package having multiple semiconductor dies receiving therein.

SUMMARY OF THE INVENTION

The package is a semiconductor package that includes a substrate having an opening approximately formed in the central portion. A first die is mounted on a die receiving area on the upper surface of the substrate by using electrically nonconductive attaching material. Preferably, the first die is precisely over the opening and the first die is coupled to conductive traces on the substrate via bonding wires. A second die is attached at the lower side surface of the first die by epoxy. The first and the second die can be selected from the IC, microprocessor or chip. The second die is electrically coupled to the conductive traces on the substrate by bonding wires. The first die and a portion of the substrate are encapsulated by using mold compound. A heat sink can be optionally positioned in the mold compound to spread the heat generated by the dies. An encapsulant is filled in the opening and covers the second die, bonding wires. A plurality of solder balls that are electrically connected with a printed circuit board are mounted on the substrate. Preferably, the solder balls are configured in a matrix configuration. The solder balls are connected with the printed circuit board so as to establish a thermal and electrical connection. The modified embodiment is also possible to use a conductive plate, such as metal plate between the first and second dies. Preferably, the conductive plate is made of cooper.

The third embodiment according to the present invention includes a multi-layer substrate. Apertures are respectively formed in the layers of the substrate and are enlarged from the layer under the uppermost layer to the lowermost layer. The apertures form in combination a cavity. Conductive traces are formed on the surface of the multi-layer substrate. A first die is attached on the top surface of the uppermost layer of the multi-layer substrate and is electrically connected to the conductive traces by using bonding wires. A second die is received in the cavity and attached on the bottom surface of the uppermost layer of the substrate. Similarly, the second die is electrically connected to the conductive traces on the substrate by using bonding wires. Mold compound covers the first die and a portion of the substrate to prevent the die, bonding wires from moisture or external force. A heat sink is optionally located on the top of the multi-layer substrate to spread heat. A cap is attached to the lower surface of the multi-layer substrate. A encapsulant is filled in the cavity. Solder balls are arranged on the lower surface of the multi-layer substrate for communicating with external modules.

DETAILED DESCRIPTION OF THE PREFERRED EMBODIMENT

The embodiments of the present invention will now be described in detail with reference to figures.

Figure 1:
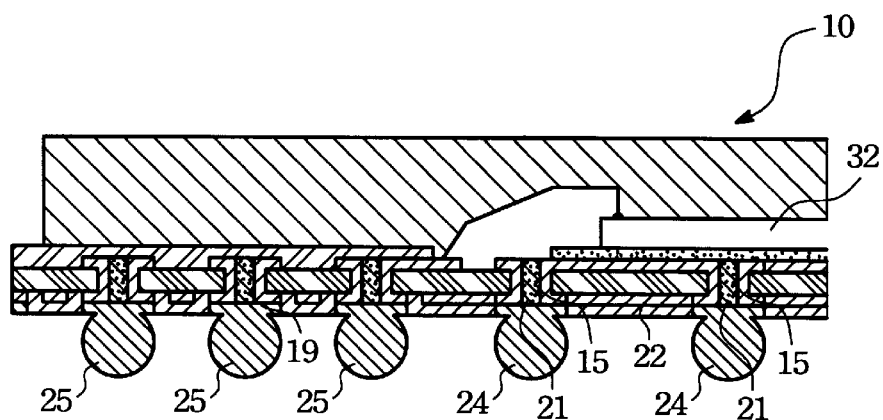
FIG. 1 is a cross section view of a structure of a ball grid array package in accordance with a prior art.
Figure 2:
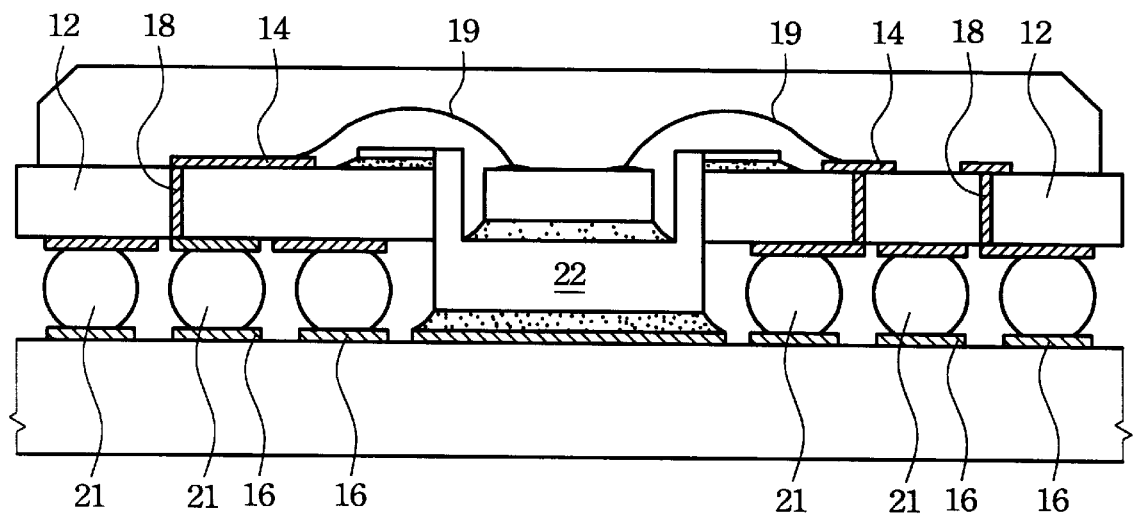
FIG. 2 is a cross section view of a structure of ball grid array package in accordance with a further prior art.
Figure 3:
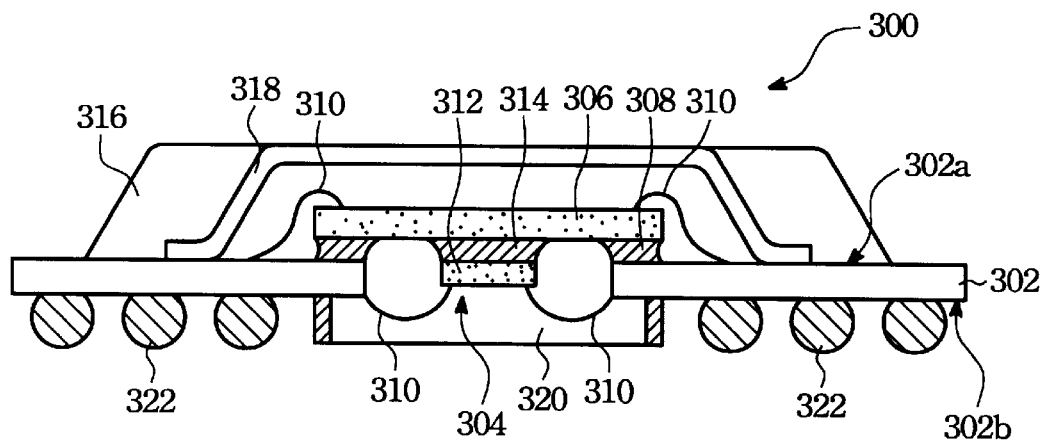
FIG. 3 is a cross sectional view of a structure of ball grid array package in accordance with a first embodiment of the present invention.
Figure 4:
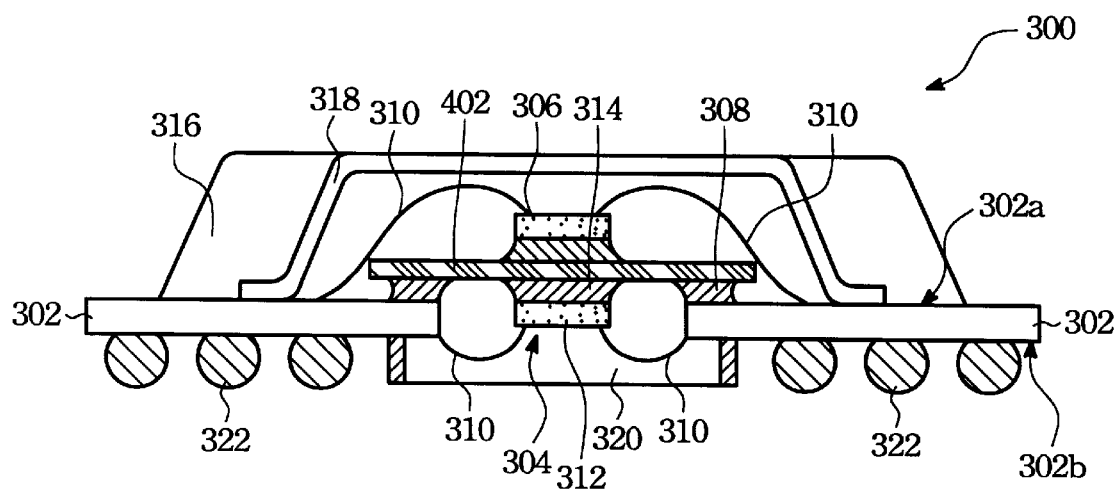
FIG. 4 is a cross sectional view of a structure of ball grid array package in accordance with a second embodiment of the present invention.
Figure 5:
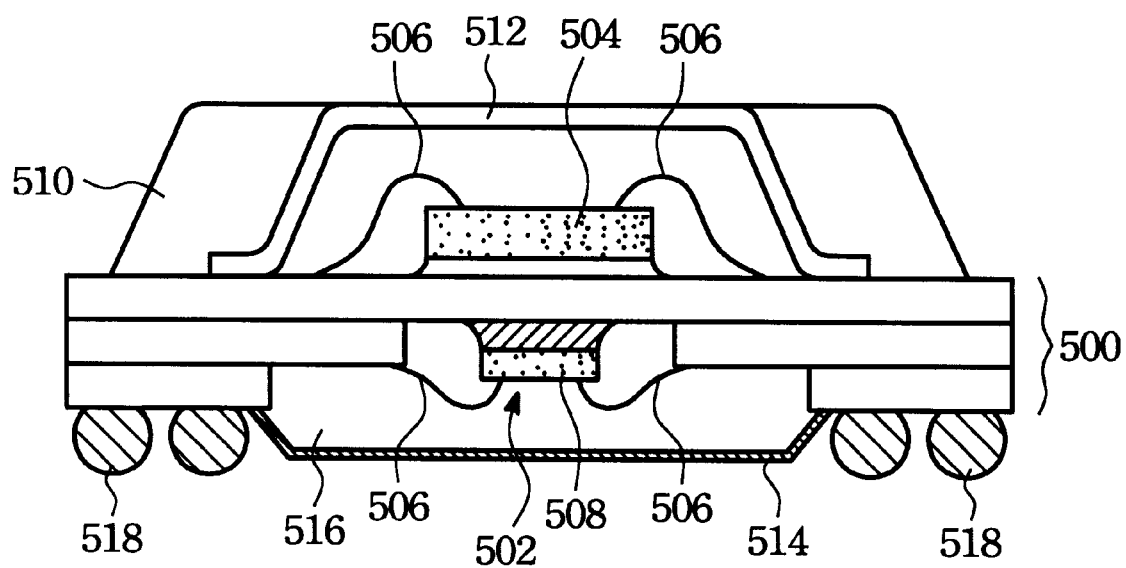
FIG. 5 is a cross sectional view of a structure of ball grid array package in accordance with a third embodiment of the present invention.

As illustrated in FIG. 3 to FIG. 5, a distinctive feature of the present invention is that the present invention can receive multiple semiconductor dies in the device. FIG. 3 is a cross sectional view of a first embodiment of a package 300 according to the present invention. The semiconductor package 300 includes a substrate 302 having an opening 304 approximately formed in the central portion of the substrate 302. The substrate 302 has a first major surface 302a and a second major surface 302b. The first major surface 302a is referred to a upper side surface and the second major surface 302b is referred to a lower side surface. The substrate is manufactured by conventional processes. The material used for the substrate 302 is, for example, polyimide, triazine, phenolic resin or bismaleimidetriazine (BT). Of course, any suitable material can be used to act as the substrate 302.

Still turning to FIG. 3, a first semiconductor die 306 is mounted on a die receiving area on the upper side surface (first major surface) 302a of the substrate 300 by using electrically nonconductive attaching material 308 such as tape, glue or the like. The first die 306 is an integrated circuits (IC), a microprocessor or a chip. Preferably, the first semiconductor die 306 is precisely over the opening 304. Using conventional wirebonding techniques, the first semiconductor die 306 is coupled to conductive traces (not shown) on the substrate 302 via conductive wires (bonding wires) 310. In addition, the bonding wires 310 are preferably made of gold or alloy. The conductive traces are typically formed on the top or bottom side surface of the substrate 302 for providing electrical connecting path to external signal. Further, in many cases, conductive traces can be formed in the substrate 302. A second semiconductor die 312 is attached on a lower side surface of the first semiconductor die 306 by an epoxy 314. Similarly, the second semiconductor die 312 can be selected from the IC, microprocessor or chip. The second die 312 is electrically coupled to the conductive traces 310 on the substrate 302 by bonding wires 310. It needs to be mentioned that the second die 312 is received in the opening 304 of the substrate 302.

The first die 306 and a portion of the first major surface 302a of the substrate 302 are encapsulated by using mold compound 316 to protect the die 306. A heat sink 318 can be optional positioned in the mold compound 316 to spread the heat generated by the dies. The top surface of the heat sink 318 can be exposed to increase the efficiency of spreading heat. An encapsulant 320 is also filled in the opening 304 and covers the second die 312, bonding wires 310. The area occupied by the encapsulant 320 is determined by a dam formed on the second major surface (bottom side surface) of the substrate 302. A plurality of solder balls (or solder bumps) 322 that are electrically connected with a printed circuit board (not shown in the drawings) are mounted on the second major surface 302b of the substrate 302. Preferably, the solder balls are configured in a matrix form. Typically, the solder balls 322 are connected with the printed circuit board so as to establish a thermal and electrical connection. The die is electrically coupled to conductive traces by using the bonding wires 30 or other well known coupling methods such as a flip chip method. That is, one end of the bonding wire is connected to the die, another end of the bonding wire 310 is connected to the solder balls 322 formed on the substrate via the conductive trace. In an example, the solder balls can be formed by ball grid array (BGA) technology. The composition of the solder balls 322 can be suitably selected an eutectic solder containing 37% lead and 63% tin.

As illustrated by the modified embodiment in the FIG. 4, it is also possible to use a conductive plate 402, such as metal or alloy plate between the first and second dies 306, 312. Preferably, the conductive plate 402 is made of cooper. In detail, the conductive plate 402 is adhered on the first major surface 302a of the substrate 302 by a tape or glue and aligned to the opening 304. The first die 306 and the second die 312 are respectively mounted on the both sides of the conductive plate 402. Other members and elements are similar to the first embodiment, therefore a detailed description is omitted.

The third embodiment according to the present invention is shown in FIG. 5, the device is a multi-chip module that includes a multi-layer substrate 500. Each layer of the multi-layer substrate 500 has an aperture formed approximately the center portion except for the uppermost layer. The apertures are respectively formed in the layers of the substrate 500 and are enlarged from the layer under the uppermost layer to the lowermost layer. The apertures form in combination a cavity 502. Conductive traces (not shown) are formed on the surface of the multi-layer substrate 500. A first die 504 is attached on the upper surface of the uppermost layer of the multi-layer substrate 500 by tape and glue, and is electrically connected to the conductive traces by using bonding wires 506. All of the embodiments of the present invention may further include contact pads formed on the surface of the substrate, and are electrically connected directly or through hole to the conductive traces. A second die 508 is received in the cavity 502 and attached on the bottom surface of the uppermost layer of the substrate 500 by tape or glue. Similarly, the second die 508 is electrically connected to the conductive traces on the substrate by using bonding wires 506. The bonding wires 506 are preferably formed of gold. Mold compound 510 covers the first die 502 and a portion of the substrate 500 to prevent the die 502, bonding wires 506 from moisture or external force. A heat sink 512 is optionally located on the top of the multi-layer substrate 500 to spread heat. A cap 514 such as metal or the like is attached to the lower surface of the multi-layer substrate 500. A further mold compound 516 is filled in the cavity 506 among the cap 514, the substrate 500 and the second die 508. Solder balls 518 are arranged on the lower surface of the multi-layer substrate 500 for communicating with external modules.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure. Thus, while the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A structure of a semiconductor package, said structure comprising:
   a substrate having a first surface and a second surface, said substrate having an opening being formed in said substrate;
   a first semiconductor die formed on said first surface of said substrate and over said opening;

a second semiconductor die attached on a lower surface of said first semiconductor die and positioned in said opening;

solder bumps coupled to said first and second dies via a plurality of bonding wires, wherein said solder bumps are arranged on said second surface of said substrate; and a first cover formed on said first surface of said substrate to protect said first die; and a second cover formed on said second surface of said substrate to protect said second die wherein said first semiconductor die is coupled to said first surface of said substrate via a first group of said plurality of bonding wires and said second semiconductor die is coupled to said second surface of said substrate via a second group of said plurality of bonding wires.

2. The structure of claim 1, wherein said first semiconductor die is formed on said substrate by using tape or glue.

3. The structure of claim 1, further comprising a heat sink formed on the first surface of said substrate to spread heat.

4. The structure of claim 1, wherein said second semiconductor die is attached on said lower surface of said first semiconductor die by using epoxy.

5. The structure of claim 1, wherein said first cover comprises mold compound.

6. The structure of claim 1, wherein said second cover comprises mold compound.

7. A structure of a semiconductor package, said structure comprising:

a substrate having a first surface and a second surface, said substrate having an opening being formed in said substrate;

a conductive plate formed on said first surface of said substrate and over said opening;

a first semiconductor die formed on a upper surface of said conductive plate;

a second semiconductor die formed on a lower surface of said conductive plate and positioned in said opening;

solder bumps coupled to said first and second dies via a plurality of bonding wires, wherein said solder bumps are arranged on said second surface of said substrate; and a first cover formed on said first surface of said substrate to protect said first die; and a second cover formed on said second surface of said substrate to protect said second die wherein said first semiconductor die is coupled to said first surface of said substrate via a first group of said plurality of bonding wires and said second semiconductor die is coupled to said second surface of said substrate via a second group of said plurality of bonding wires.

8. The structure of claim 7, wherein said conductive plate comprises a copper plate.

9. The structure of claim 7, further comprising a heat sink formed on the first surface of said substrate to spread heat.

10. The structure of claim 1, wherein said conductive plate is formed on said first surface of said substrate by tape or glue.

11. The structure of claim 1, wherein said first cover comprises mold compound.

12. The structure of claim 1, wherein said second cover comprises mold compound.

13. A structure of a semiconductor package, said structure comprising:

a multi-layer substrate, each layer of said multi-layer substrate having an aperture formed approximately a center portion of said multi-layer substrate except for a uppermost layer, wherein said aperture of said each layer is enlarged from a layer under said uppermost layer to a lowermost layer, thereby forming a cavity;

a first semiconductor die attached on a upper surface of said uppermost layer of said multi-layer substrate;

a second semiconductor die in said cavity and attached on a lower surface of said uppermost layer of said multi-layer substrate;

a first cover on a upper surface of said multi-layer substrate;

a second cover attached to a lower surface of said multi-layer substrate; and solder bumps arranged on said lower surface of said multi-layer substrate for communicating with external modules and electrically connected to said first and second semiconductor dies by bonding wires wherein said first semiconductor die is coupled to said first surface of said substrate via a first group of said plurality of bonding wires and said second semiconductor die is coupled to said second surface of said substrate via a second group of said plurality of bonding wires.

14. The structure of claim 13, wherein said first semiconductor die is formed on said substrate by using tape or glue.

15. The structure of claim 13, further comprising a heat sink formed on the first surface of said substrate to spread heat.

16. The structure of claim 13, wherein said second semiconductor die is attached on said multi-layer substrate by using tape or glue.

17. The structure of claim 13, wherein said first cover comprises mold compound.

18. The structure of claim 13, wherein said second cover comprises a cap attached on said lower surface of said multi-layer substrate, compound being filled in said cap.

* * * * *